(12) United States Patent
Alessio Verni et al.

(10) Patent No.: US 12,469,695 B2
(45) Date of Patent: Nov. 11, 2025

(54) METHODS AND SYSTEMS FOR FORMING A LAYER COMPRISING VANADIUM AND NITROGEN

(71) Applicant: ASM IP Holding B.V., Almere (NL)

(72) Inventors: Giuseppe Alessio Verni, Jodoigne (BE); Ren-Jie Chang, Leuven (BE); Qi Xie, Wilsele (BE); Timothee Blanquart, Oud-Heverlee (BE); Eric Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 593 days.

(21) Appl. No.: 17/680,761

(22) Filed: Feb. 25, 2022

(65) Prior Publication Data

US 2022/0285146 A1 Sep. 8, 2022

Related U.S. Application Data

(60) Provisional application No. 63/155,388, filed on Mar. 2, 2021.

(51) Int. Cl.
*H01L 21/02* (2006.01)
*H10B 12/00* (2023.01)

(52) U.S. Cl.
CPC .... *H01L 21/0228* (2013.01); *H01L 21/02172* (2013.01); *H01L 21/02252* (2013.01); *H10B 12/03* (2023.02); *H10B 12/05* (2023.02); *H10B 12/30* (2023.02)

(58) Field of Classification Search
CPC .................................................. H01L 21/0228
See application file for complete search history.

(56) References Cited

U.S. PATENT DOCUMENTS

| 4,300,149 A * | 11/1981 | Howard | H10D 64/64 257/E23.162 |
| 4,621,277 A | 11/1986 | Ito | |
| 6,319,766 B1 * | 11/2001 | Bakli | H01L 21/318 438/785 |
| 8,557,712 B1 | 10/2013 | Antonelli et al. | |
| 9,685,371 B2 | 6/2017 | Zope et al. | |
| 2005/0260357 A1 * | 11/2005 | Olsen | H01L 21/0234 257/E21.267 |
| 2015/0160149 A1 * | 6/2015 | Bae | G01N 27/127 204/431 |
| 2017/0350012 A1 * | 12/2017 | Moon | C23C 16/45544 |
| 2019/0351595 A1 * | 11/2019 | Moreels | C04B 14/06 |
| 2020/0194304 A1 * | 6/2020 | Roy | H01L 21/76877 |
| 2020/0365447 A1 | 11/2020 | Mays et al. | |

(Continued)

OTHER PUBLICATIONS

Galesic, et al.; Formation of vanadium nitride by rapid thermal processing; Thin Solid Films 349 (1999): 14-18.

(Continued)

*Primary Examiner* — Mounir S Amer
(74) *Attorney, Agent, or Firm* — Snell & Wilmer L.L.P.

(57) ABSTRACT

Disclosed are methods and systems for depositing layers comprising a metal and nitrogen. The layers are formed onto a surface of a substrate. The deposition process may be a cyclical deposition process. Exemplary structures in which the layers may be incorporated include field effect transistors, VNAND cells, metal-insulator-metal (MIM) structures, and DRAM capacitors.

18 Claims, 12 Drawing Sheets

(56) References Cited

U.S. PATENT DOCUMENTS

2021/0285102 A1  9/2021  Yoon et al.

OTHER PUBLICATIONS

Merdrignac-Conanec, et al.; Nitridation under ammonia of high surface area vanadium aerogels; Journal of Solid State Chemistry 178 (2005): 218-223.

Oyama, et al.; Topotactic synthesis of vanadium nitride solid foams; Journal of materials research 8.6 (1993): 1450-1454.

Transition metal. Referenced from Encyclopaedia Britannica (Year: 1998); https://www.britannica.com/science/transition-metal; 11pp.

Group VIA-Chaicogens. Referenced from ChemPrime LibreTexts; https://chem.libretexts.org.@go/page/49509 (year: 2025); 2pp.

Halogen. References from Encyclopaedia Britannica (Year: 1998); https://www.britannica.com/science/halogen; 10pp.

\* cited by examiner

METHODS AND SYSTEMS FOR FORMING A LAYER COMPRISING VANADIUM AND NITROGEN

CROSS-REFERENCE TO RELATED APPLICATIONS

This application claims priority to U.S. Provisional Patent Application Ser. No. 63/155,388 filed Mar. 2, 2021 titled METHODS AND SYSTEMS FOR FORMING A LAYER COMPRISING VANADIUM AND NITROGEN, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for forming layers comprising a metal and nitrogen are disclosed.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in aggressively scaled CMOS devices. Various gate materials might be used, such as, for example, a metal, such as a titanium nitride layer. However, in some cases, where higher work function values than those obtained with titanium nitride layers—e.g., in PMOS regions of a CMOS device—are desired, improved materials for gate electrodes are desired. In particular, such materials can include p-dipole shifting layers, and can be used, e.g., for threshold voltage tuning.

In addition, there remains a need for new materials in other semiconductor devices such as MIM (metal-insulator-metal) structures, DRAM capacitors, and VNAND cells.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising a metal and nitrogen, to structures and devices formed using such methods, and to apparatus for performing the methods and/or forming the structures and/or devices. The layers may be used in a variety of applications, including work function adjustment layers, and threshold voltage adjustment layers. For example, they may be used in a gate electrode in n- or p-channel metal oxide semiconductor field effect transistors (MOSFETS).

Described herein is a method for forming a layer comprising a metal nitride on a substrate. The method comprises providing the substrate to a reaction chamber, depositing a metal oxide on the substrate, and exposing the substrate to a nitrogen-containing reactant. Thus, the metal oxide is converted to a metal nitride.

In some embodiments, depositing a metal oxide on the substrate comprises a deposition cycle. The deposition cycle comprises a metal precursor pulse and an oxygen reactant pulse. The metal precursor pulse comprises exposing the substrate to a metal precursor. The oxygen reactant pulse comprises exposing the substrate to an oxygen reactant.

In some embodiments, the oxygen reactant is selected from $O_2$, $H_2O$, and $H_2O_2$.

In some embodiment, the metal nitride comprises a transition metal nitride, and the metal oxide comprises a transition metal oxide.

In some embodiments, the metal nitride comprises vanadium nitride, and the metal oxide comprises vanadium oxide.

In some embodiments, the metal precursor comprises a transition metal precursor.

In some embodiments, the metal precursor is selected from a halide, an oxyhalide, and an organometallic compound.

In some embodiments, the metal precursor comprises a vanadium precursor.

In some embodiments, the vanadium precursor comprises a vanadium halide.

In some embodiments, the vanadium halide comprises vanadium chloride.

In some embodiments, the metal precursor comprises a vanadium beta-diketonate.

In some embodiments, the method comprises a plurality of deposition cycles.

In some embodiments, subsequent deposition cycles are separated by an inter-deposition cycle purge.

In some embodiments, the metal precursor pulse and the oxygen reactant pulse are separated by an intra deposition cycle purge.

In some embodiments, depositing the metal oxide on the substrate and exposing the substrate to a nitrogen-containing reactant are separated by post metal oxide deposition purge.

In some embodiments, the method comprises executing a plurality of super cycles. A super cycle comprises depositing the metal oxide on the substrate and exposing the substrate to a nitrogen-containing reactant.

In some embodiments, subsequent super cycles are separated by an inter super cycle purge.

In some embodiments, exposing the substrate to a nitrogen-containing reactant comprises providing a nitrogen reactant to the reaction chamber. The nitrogen reactant can be selected from $NH_3$, $N_2H_2$, and $N_2$.

In some embodiments, exposing the substrate to a nitrogen-containing reactant comprises generating a nitrogen-containing plasma in the reaction chamber.

In some embodiments, generating a nitrogen-containing plasma in the reaction chamber comprises providing a nitrogen-containing plasma gas to the reaction chamber.

In some embodiments, the nitrogen-containing plasma gas comprises at least one nitrogen-containing gas selected from $NH_3$, $N_2$, and $N_2H_2$.

In some embodiments, the method is carried out until a metal nitride containing layer having a thickness of least 0.2 nm to at most 5 nm is formed on the substrate.

In some embodiments, the substrate comprises a monocrystalline silicon wafer.

In some embodiments, the oxygen reactant comprises $H_2O$.

Further described herein is a gate-all-around field effect transistor comprising a gate contact comprising a layer formed according to a method as described herein.

Further described herein is a MIM metal electrode comprising a layer deposited by means of a method as described herein.

Further described herein is a VNAND contact comprising a layer deposited by means of a method as described herein.

Further described herein is a system comprising a reaction chamber, a precursor gas source, a reactant gas source, and a controller. The precursor gas source comprises a metal precursor. The metal precursor comprises vanadium. The reactant gas source comprises a reactant. The reactant contains nitrogen. The controller is configured to control gas flow into the reaction chamber to form a layer on the substrate by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
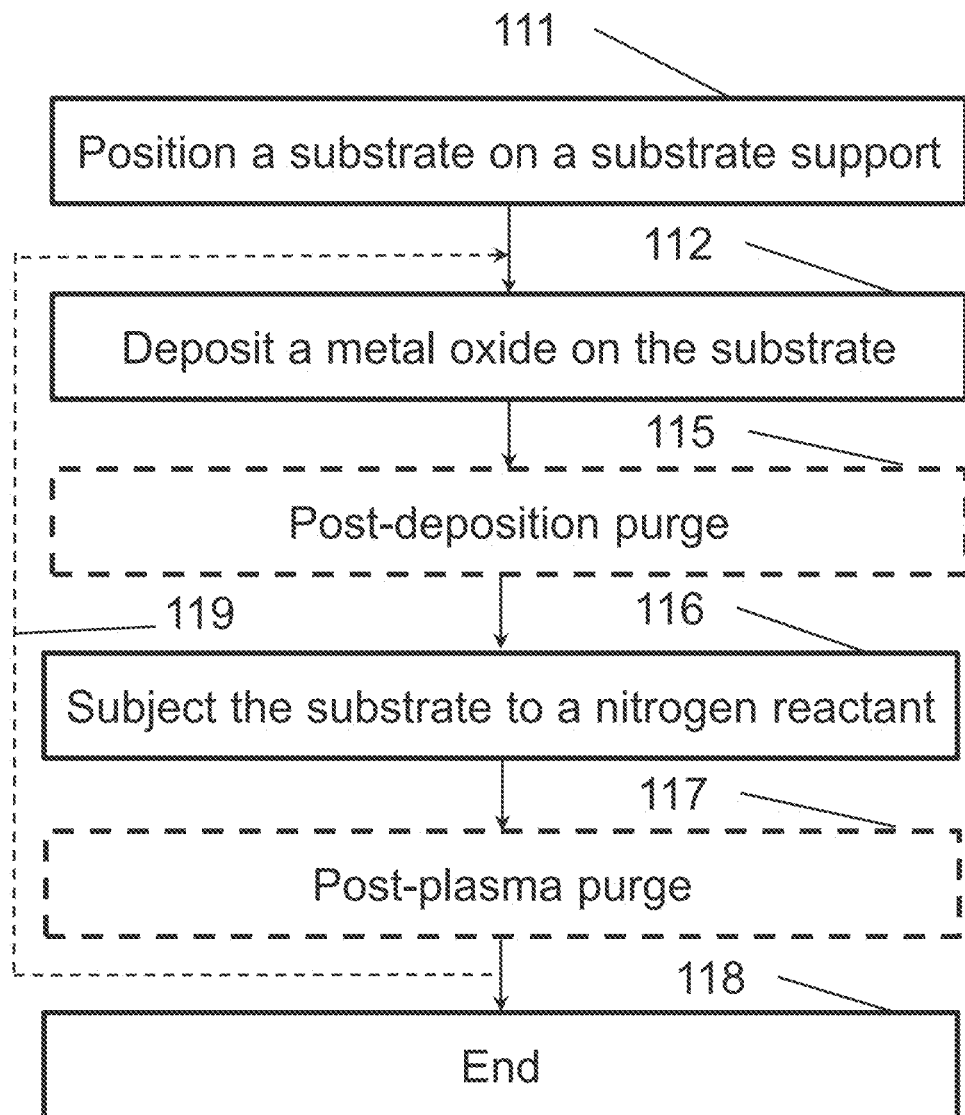
FIG. 1 illustrates an embodiment of a method as disclosed herein.
Figure 2:
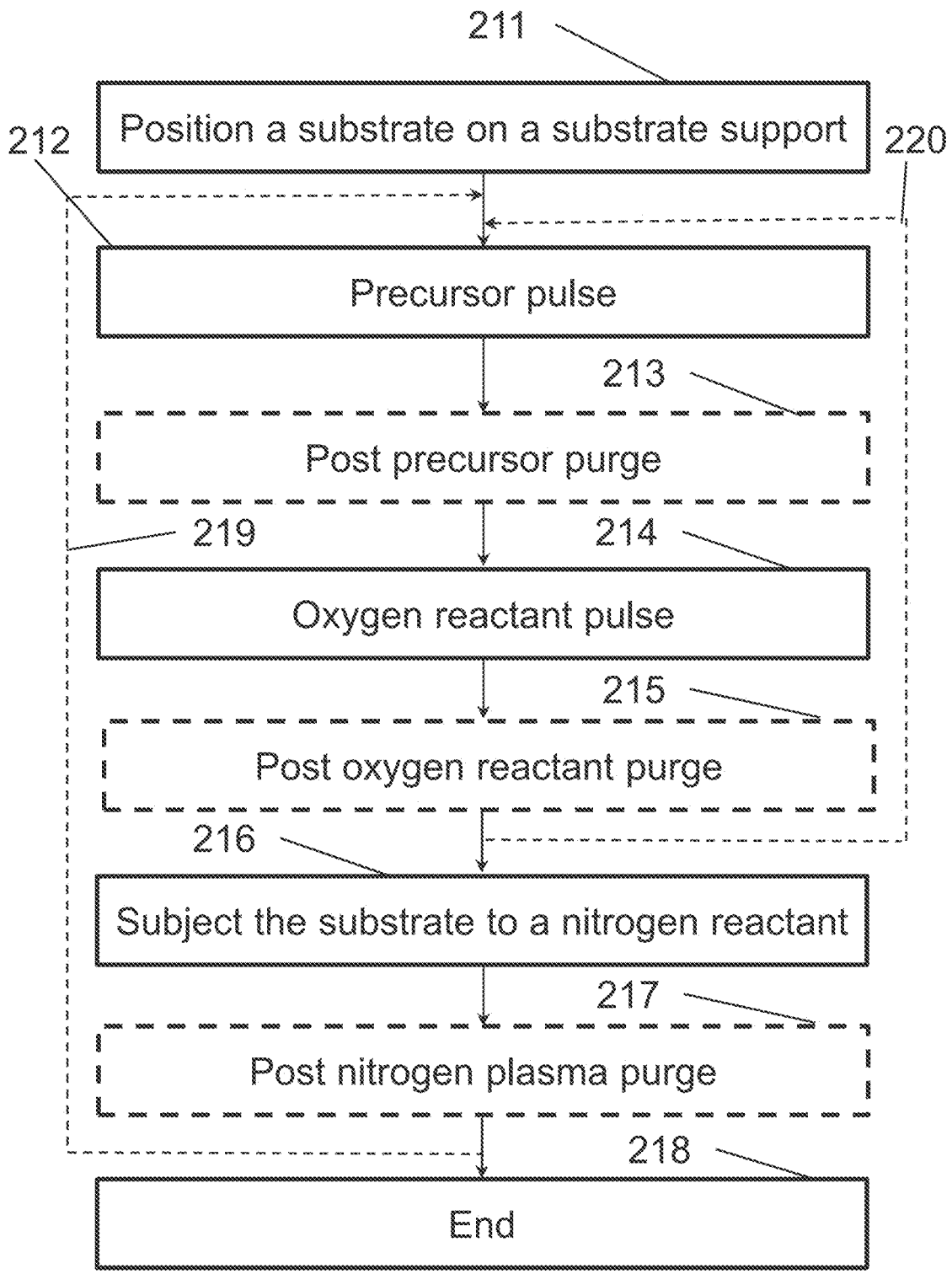
FIG. 2 illustrates an embodiment of a method as disclosed herein.
Figure 12:
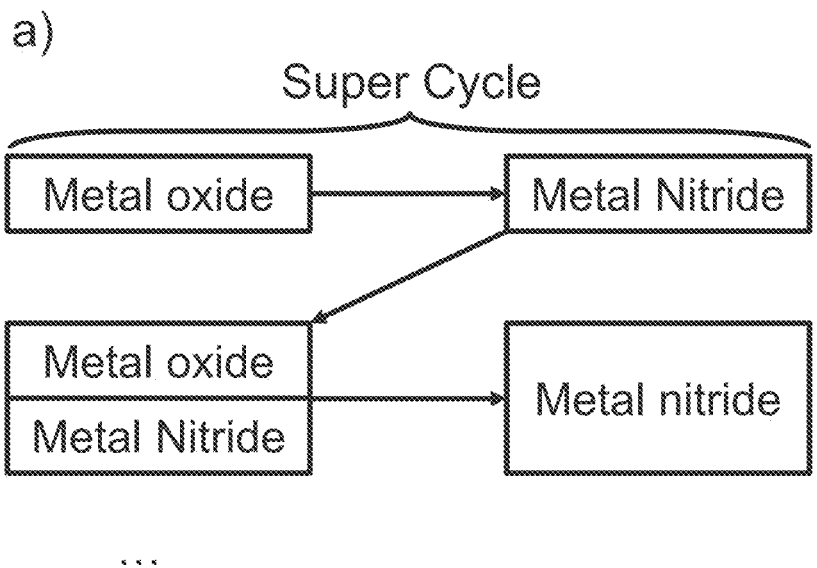
Figure 12:
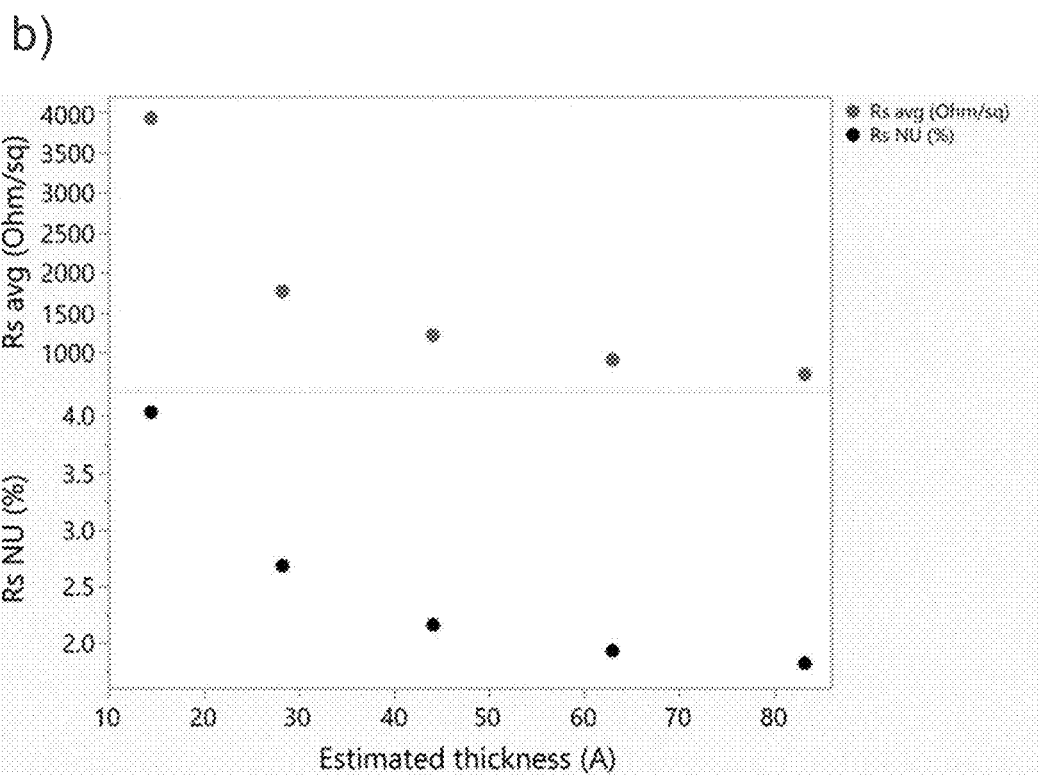

FIG. 12, panel a) shows the result of a cyclical deposition process as described in FIG. 1 or 2. FIG. 12, panel b) shows sheet resistance data of a layer deposited according to an embodiment of a method as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for forming structures, such as gate electrode structures. Exemplary methods can be used to, for example, to form CMOS devices, or portions of such devices. This notwithstanding, and unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. Byway of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

The term "oxygen reactant" can refer to a gas or a material that can become gaseous and that can be represented by a chemical formula that includes oxygen. In some cases, the chemical formula includes oxygen and hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

In this disclosure, any defined meanings do not necessarily exclude ordinary and customary meanings, in some embodiments.

Described herein is a method for forming a layer comprising a metal nitride on a substrate. The method comprises providing the substrate in a reaction chamber and depositing a metal oxide on the substrate. It shall be understood that the metal oxide comprises a metal and oxygen. The method further comprises exposing the substrate to a nitrogen-containing reactant. By exposing the substrate to the nitrogen-containing reactant, the metal oxide is converted to a metal nitride. The layers formed according to the present methods are highly advantageous, e.g. for the purpose of work function tuning, stress management, and resistivity tuning.

Layers formed using a presently described method may be useful, for example, as gate stack work function tuning metals in P- or N-MOSFETS. Additionally or alternatively, they may be used in MIM metal electrodes and/or in VNAND contacts.

In some embodiments, the metal nitride comprises a transition metal nitride, and the metal oxide comprises a transition metal oxide. Additionally or alternatively, the metal nitride comprises a rare earth metal nitride, and the metal oxide comprises a rare earth metal oxide. In some embodiments, the metal nitride comprises vanadium nitride, and the metal oxide comprises vanadium oxide.

In some embodiments, the vanadium content of a layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the nitrogen content of the layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

Depositing the layer comprising a metal and oxygen may comprise executing a cyclical deposition process. The cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, i.e., of non-self-limiting gas phase reactions, but still taking advantage of the sequential introduction of reactants. Such a process may be referred to as cyclical CVD. In some embodiments, a cyclical CVD process may comprise the introduction of two or more precursors or reactants into the reaction chamber, wherein there may be a time period of overlap between the two or more reactants in the reaction chamber resulting in both an ALD component of the deposition and a CVD component of the deposition. This is referred to as a hybrid process. In accordance with further examples, a cyclical deposition process may comprise a continuous flow of one reactant or precursor and periodic pulsing of a second reactant or precursor into the reaction chamber.

In some embodiments, the nitrogen reactant is continuously provided to the reaction chamber. In other words, and in some embodiments, the nitrogen reactant can be constantly and non-intermittently provided to the reaction chamber. Thus, in some embodiments, the nitrogen reactant can be provided to the reaction chamber both during the step of depositing the metal oxide on the substrate, and during the step of exposing the substrate to a nitrogen-containing reactant. In such embodiments, the oxygen reactant and the metal precursor are suitably provided to the reaction chamber intermittently, i.e. in pulses that are at least partially separated in time and/or in space, as described elsewhere herein. Continuously providing the nitrogen reactant to the reaction chamber may advantageously increase growth rate.

In accordance with some examples of the disclosure, depositing the metal oxide comprises a thermal deposition process. In these cases, the deposition process does not include use of a plasma to form activated species for use in the deposition process.

In some embodiments, depositing a metal oxide on the substrate comprises executing a deposition cycle. The deposition cycle comprising a metal precursor pulse and an oxygen reactant pulse. The metal precursor pulse comprises exposing the substrate to a metal precursor. The oxygen reactant pulse comprises exposing the substrate to an oxygen reactant.

In some embodiments, a layer thus formed has a step coverage equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 to about 25.

In some embodiments, the metal precursor pulse lasts from at least 0.25 s to at most 4.0 s, or from at least 0.5 s to at most 2.0 s, or from at least 1.0 s to at most 1.5 s. In some embodiments, the oxygen reactant pulse lasts from at least 0.25 s to at most 4.0 s, or from at least 0.5 s to at most 2.0 s, or from at least 1.0 s to at most 1.5 s.

In some embodiments, the method comprises a plurality of deposition cycles. Thus, a metal nitride layer having a desired thickness can be formed on the substrate. In particular, the method can comprise performing a specific number of deposition cycles before exposing the substrate to a nitrogen-containing reactant. Thus, a pre-determined amount of metal oxide can be deposited on the substrate before the metal oxide is converted to a metal nitride by exposing the substrate to a nitrogen-containing reactant. It shall be understood that the exact number of deposition cycles that are performed until the substrate is subjected to a nitrogen containing reactant, can depend on the specific material which is deposited. In some embodiments, the method comprises executing from at least 2 deposition cycles to at most 10 deposition cycles for every exposure to a nitrogen reactant. In some embodiments, the method comprises executing from at least 3 deposition cycles to at most 8 deposition cycles for every nitrogen reactant exposure. In some embodiments, the method comprises executing from at least 4 deposition cycles to at most 6 deposition cycles for every nitrogen reactant exposure.

In some embodiments, subsequent deposition cycles are separated by an inter-deposition cycle purge. In some embodiments, the duration of the inter-deposition cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, the metal precursor pulse and the oxygen reactant pulse are separated by an intra deposition cycle purge. In some embodiments, the duration of the intra deposition cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, depositing the metal oxide on the substrate comprises depositing a metal oxide layer having a thickness of at least 1.0 nm to at most 10.0 nm, or of at least 2.0 nm to at most 5.0 nm, e.g. of at least 4.0 nm. Efficient conversion form oxide to nitride can occur when the present methods comprise alternatingly depositing metal oxide layers having such a thickness on the one hand, and exposing the substrate to a nitrogen-containing reactant.

In some embodiments, depositing the metal oxide on the substrate and exposing the substrate to a nitrogen-containing reactant are separated by post metal oxide deposition purge. In some embodiments, the duration of the post metal oxide deposition purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, exposing the substrate to a nitrogen-containing reactant lasts from at least 0.25 s to at most 4.0 s, or from at least 0.5 s to at most 2.0 s, or from at least 1.0 s to at most 1.5 s.

It shall be understood that providing purge steps between different method steps suitably allows minimizing parasitic reactions between different precursors and reactants. It shall be understood that no plasma is generated in the reaction chamber during the purges.

In some embodiments, the method comprises executing a plurality of super cycles. A super cycle comprises depositing the metal oxide on the substrate, and exposing the substrate to a nitrogen-containing reactant. In some embodiments, subsequent super cycles are separated by an inter super cycle purge.

The total number of super cycles comprised in a method as described herein depends, inter alia, on the total layer thickness which is desired. In some embodiments, the method comprises from at least 1 super cycle to at most 100 super cycles, or from at least 2 super cycles to at most 80 super cycles, or from at least 3 super cycles to at most 70 super cycles, or from at least 4 super cycles to at most 60 super cycles, or from at least 5 super cycles to at most 50 super cycles, or from at least 10 super cycles to at most 40 super cycles, or from at least 20 super cycles to at most 30 super cycles. In some embodiments, the method comprises at most 100 super cycles, or at most 90 super cycles, or at most 80 super cycles, or at most 70 super cycles, or at most 60 super cycles, or at most 50 super cycles, or at most 40 super cycles, or at most 30 super cycles, or at most 20 super cycles, or at most 10 super cycles, or at most 5 super cycles, or at most 4 super cycles, or at most 3 super cycles, or at most 2 super cycles, or a single super cycle.

In some embodiments, the layer thus formed has a thickness from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm.

In some embodiments, the layer thus formed has a thickness of at most 5.0 nm, or a thickness of at most 4.0 nm, or a thickness of at most 3.0 nm, or a thickness of at most 2.0 nm, or a thickness of at most 1.5 nm, or a thickness of at most 1.0 nm, or a thickness of at most 0.8 nm, or a thickness of at most 0.6 nm, or a thickness of at most 0.5 nm, or a thickness of at most 0.4 nm, or a thickness of at most 0.3 nm, or a thickness of at most 0.2 nm, or a thickness of at most 0.1 nm.

In some embodiments, the metal precursor comprises a transition metal precursor. The metal precursor can, in some embodiments, be selected from a halide, an oxyhalide, and an organometallic compound.

In some embodiments, the metal precursor comprises a vanadium precursor. Suitable vanadium precursors include halides and organometallic vanadium compounds. Thus, in some embodiments, the vanadium precursor comprises a vanadium halide such as vanadium chloride, vanadium fluoride, vanadium bromide, or vanadium iodide.

In some embodiments, the vanadium precursor comprises a vanadium beta diketonate. Exemplary vanadium beta-diketonate compounds include $VO(acac)_2$, $VO(thd)_2$, $V(acac)_3$, $V(thd)_3$ (respectively named as oxobis(2,4-pentanedionato)vanadium(IV), oxobis(2,2,6,6-tetramethyl-3,5-hepanedionato)vanadium(IV), tris(2,4-pentanedionato)vanadium(IV), and tris(2,2,6,6-tetramethyl-3,5-hepanedionato)vanadium(IV)), and the like.

The vanadium comprised in the vanadium precursor can have any suitable oxidation state. For example, and in some embodiments, the vanadium comprised in the vanadium precursor can have an oxidation state of II, III, IV; or a mixture thereof. In some embodiments, the vanadium precursor comprises one or more compounds selected from vanadium (II) chloride, vanadium (III) chloride, vanadium (IV) chloride; and a mixture thereof.

In some embodiments, the vanadium precursor comprises one or more of a vanadium halide, a vanadium oxyhalide, and a vanadium organometallic compound. Thus, in some embodiments, the vanadium precursor comprises a vanadium halide. In some embodiments, the vanadium precursor comprises a vanadium oxyhalide. In some embodiments, the vanadium precursor comprises vanadium oxychloride. In some embodiments, the vanadium precursor comprises a vanadium alkoxide. In some embodiments, the vanadium precursor comprises Vanadium(V) oxytriethoxide. In some embodiments, the vanadium precursor comprises Vanadium (V) oxytripropoxide. In some embodiments, the vanadium precursor comprises a vanadium organometallic compound. In some embodiments, the vanadium precursor comprises $VCl_4$. In some embodiments, the vanadium precursor comprises a vanadium beta-diketonate. In some embodiments, the vanadium precursor comprises Vanadium(III) acetylacetonate.

In some embodiments, the vanadium precursor can include one or more of a vanadium halide, a vanadium oxyhalide, a vanadium beta-diketonate compound, a vanadium cyclopentadienyl compound, a vanadium alkoxide compound, a vanadium dialkylamido compound, or the like.

Exemplary vanadium dialkylamido compounds include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Exemplary vanadium alkoxide compounds include $V(OMe)_4$, $V(OEt)_4$, $V(OiPr)_4$, $V(OtBu)_4$, $VO(OMe)_3$, $VO(OEt)_3$, $VO(OiPr)_3$, and $VO(OtBu)_3$, (respectively named as tetrakis(methoxy)vanadium(IV), tetrakis(ethoxy)vanadium(IV), tetrakis(isopropoxy)vanadium(IV), tetrakis (t-butoxy)vanadium(IV), oxotris(methoxy)vanadium(IV), oxotris(ethoxy)vanadium(IV), oxotris(isopropoxy)vanadium(IV), and, oxotris(t-butoxy)vanadium(IV)). Additional vanadium alkoxide compounds include variations of these compounds, where other alkoxy ligands are used.

Exemplary vanadium cyclopentadienyl compounds include $VCp_2Cl_2$, $VCp_2$, $VCp_2(CO)_4$, (respectively named as bischlorobis(cyclopentdienyl)vanadium(IV), bis(cyclopentadienyl)vanadium(II), and cyclopentadienylvanadium tetracarbonyl)). Additional exemplary vanadium cyclopentadienyl compounds include variations of these compounds, where Cp is either unsubstituted or bearing one or more alkyl groups, e.g., MeCp, EtCp, iPrCp, and the like.

By way of particular examples, a vanadium halide can be selected from one or more of a vanadium fluoride, a vanadium chloride, a vanadium bromide, and a vanadium iodide. The vanadium halide can include only vanadium and one or more halogens—e.g., vanadium tetrachloride or the like. A vanadium oxyhalide can be selected from one or more of vanadium oxyhalides, such as one or more of a vanadium oxyfluoride, a vanadium oxychloride, a vanadium oxybromide, and a vanadium oxyiodide. The vanadium oxyhalide can include only vanadium, oxygen, and one or more halides. By way of examples, the vanadium halide and oxyhalide can be selected from the group consisting of include one or more of $VCl_4$, $VBr_4$, $VI_4$, $VOCl_4$, $VOBr_3$, $VOI_3$ (respectively named as vanadium tetrachloride, vanadium tetrabromide, vanadium tetraiodide, vanadiumoxytrichloride, vanadiumoxytribromide, and vanadiumoxytriiodide). For example, the vanadium precursor may comprise $VCl_4$.

Use of vanadium halide precursors can be advantageous relative to methods that use other precursors, such as vanadium metalorganic precursors, because the vanadium halide precursors can be relatively inexpensive, can result in vanadium layers with lower concentrations of impurities, such as carbon, and/or processes that use such precursors can be more controllable-compared to processes that use metalorganic or other vanadium precursors. In addition, processes that use vanadium halide may be easier to scale up, compared to methods that use organometallic vanadium precursors. In some embodiments, the use of halide-free precursors can be advantageous, e.g. when it is desirable to minimize or avoid etching of exposed dielectric layers, e.g. high-k dielectric layers.

Exemplary nitrogen reactants can be selected from one or more of ammonia ($NH_3$), hydrazine ($N_2H_4$), other nitrogen and hydrogen-containing gases (e.g., a mixture of nitrogen gas and hydrogen gas), and the like. An exemplary nitrogen and hydrogen-containing gas includes forming gas. The nitrogen reactant can include or consist of nitrogen and hydrogen. In some cases, the nitrogen reactant does not include diatomic nitrogen. In some embodiments, the nitrogen reactant comprises ammonia and/or hydrazine. In some embodiments, the nitrogen reactant comprises ammonia. In some embodiments, the nitrogen reactant comprises hydrazine. In some embodiments, the nitrogen reactant includes one or more gasses selected from $NH_3$, $N_2H_2$, and $N_2$.

In some embodiments, exposing the substrate to a nitrogen-containing reactant comprises exposing the substrate to a nitrogen plasma, i.e. to a plasma in which employs a plasma gas comprising nitrogen. It shall be understood that the terms "nitrogen reactant" and "nitrogen-containing reactant" can be used interchangeably. In other words, and in some embodiments, exposing the substrate to a nitrogen-containing reactant comprises generating a nitrogen-containing plasma in the reaction chamber. Suitably, generating a nitrogen-containing plasma in the reaction chamber can comprise providing a nitrogen-containing plasma gas to the reaction chamber. Suitable nitrogen-containing plasma gasses include at least one nitrogen-containing gas selected from $NH_3$, $N_2$, and $N_2H_2$. Thus, exposing the substrate to a nitrogen-containing reactant can comprise a direct nitrogen plasma treatment.

In some embodiments, exposing the substrate to a nitrogen-containing reactant comprises generating a nitrogen plasma in a remote plasma generator. The remote plasma generator is suitably positioned outside of the reaction chamber, and can be adjacent to the reaction chamber, or it can be positioned at a pre-determined distance from the reaction chamber. The remote plasma generator can be operationally connected with the reaction chamber via a reactive species duct such as a stainless steel pipe. Thus, reactive species, e.g., at least one of radicals and ions, can be brought from the remote plasma generator to the reaction chamber. Optionally, the reactive species duct can comprise one or more mesh plates. Mesh plates advantageously block charges species, i.e., ions, while letting uncharged reactive species such as radicals pass. Thus, the substrate can be advantageously exposed to radicals only.

Suitable oxygen reactants comprise oxygen-containing gasses or compounds such as $O_2$, $H_2O$, and $H_2O_2$. In some embodiments, the oxygen reactant comprises $H_2O$.

In some embodiments, the oxygen reactant comprises an alcohol, e.g. a linear or branched alkyl alcohol. In some embodiments, the oxygen reactant comprises a C1 to C4 linear or branched alkyl alcohol. In some embodiments, the oxygen reactant comprises methanol. In some embodiments, the oxygen reactant comprises ethanol.

In some embodiments, the metal oxide is deposited at a substrate temperature of less than 800° C., or of at least 400° C. to at most 500° C., or of at least 300° C. to at most 400° C., or of at least 200° C. to at most 300° C., or of at least 100° C. to at most 200° C., or of at least 150° C. to at most 500° C., or of at least 200° C. to at most 400° C., or of at least 250° C. to at most 350° C.

In some embodiments, and while the substrate is exposed to the nitrogen reactant, the substrate is maintained at a temperature of less than 800° C., or of at least 20° C. to at most 800° C., or of at least 200° C. to at most 700° C., or of at least 300° C. to at most 600° C., or of at least 400° C. to at most 500° C. In some embodiments, and while the substrate is exposed to the nitrogen reactant, the substrate is maintained at a temperature of at least 100° C. to at most 200° C., or of at least 200° C. to at most 300° C., or of at least 300° C. to at most 400° C., or of at least 400° C. to at most 500° C., or of at least 500° C. to at most 600° C., or of at least 600° C. to at most 700° C., or of at least 700° C. to at most 800° C.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the layer is deposited at a pressure of at mot 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.2 Torr to at most 5 Torr, or at a pressure of at least 0.5 Torr to at most 2.0 Torr.

In the following paragraph, process conditions are given for a reaction chamber volume of 1 liter and for 300 mm wafers. The skilled person understands that these values can be readily extended to other reaction chamber volumes and wafer sizes.

In some embodiments, the precursors and/or the reactant are entrained by a carrier gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. In some embodiments, $N_2$ is used as a carrier gas. In some embodiments, a noble gas is used as a carrier gas. Suitable noble gasses include He, Ne, Ar, and Xe.

In some embodiments, the method further comprises a step of curing the metal nitride. In some embodiments, curing can be performed after the entire metal nitride layer has been deposited. Alternatively, curing can be done cyclically. For example, a method as described herein can comprise a curing step after each step of exposing the substrate to a nitrogen-containing reactant. Alternatively, a method as described herein can comprise a curing step after every other step of exposing the substrate to a nitrogen-containing reactant. Alternatively, a method as described herein can comprise a curing step after from at least 1% to at most 2%, or from at least 2% to at most 5%, or from at least 5% to at most 10%, or from at least 10% to at most 20%, or from at least 20% to at most 50%, or from at least 50% to at most 100 of the steps of exposing the substrate to a nitrogen-containing reactant.

In some embodiments, the method further comprises a step of curing the metal oxide layer before it is converted to a metal nitride. In some embodiments, curing can be done once after all metal oxide has been deposited. Alternatively, curing can be done cyclically. For example, a method as described herein can comprise a curing step after each step of depositing a metal oxide layer. Alternatively, a method as described herein can comprise a curing step after every other step of depositing a metal oxide layer. Alternatively, a method as described herein can comprise a curing step after from at least 1% to at most 2%, or from at least 2% to at most 5%, or from at least 5% to at most 10%, or from at least 10% to at most 20%, or from at least 20% to at most 50%, or from at least 50% to at most 100 of the steps of depositing a metal oxide layer.

A curing step suitably comprises subjecting the substrate to a form of energy, e.g. at least one of heat energy, radiation, and particles. Exemplary curing steps comprise exposing the substrate to UV radiation. Additionally or alternatively, a curing step can comprise exposing the substrate to a direct plasma, e.g. a noble gas plasma such as an argon plasma. Additionally or alternatively, a curing step can comprise exposing the substrate to one or more reactive species such as ions and/or radicals generated in a remote plasma, e.g., a remote noble gas plasma, such as a remote argon plasma. Additionally or alternatively, a curing step can comprise exposing the substrate to photons, e.g., at least one of UV photons, photons in the visible spectrum, IR photons, and photons in the microwave spectrum. Additionally or alternatively, a curing step can comprise heating the substrate.

In some embodiments, the method is carried out until a metal nitride containing layer having a thickness of least 0.2 nm to at most 5 nm is formed on the substrate.

A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

The presently described methods can be advantageously used for filling a gap feature with a metal nitride such as vanadium nitride. Exemplary gaps include recesses, contact holes, vias, trenches, and the like. Thus, further provided herein is a method for filling a gap. The method comprises providing a substrate provided with a gap feature in a reaction chamber, depositing a metal oxide on the substrate by means of a method as described herein, and exposing the substrate to a nitrogen-containing reactant. It shall be understood that the metal oxide is preferentially deposited at the bottom of the gap feature. In other words, more metal oxide is deposited in a lower/deeper portion of the gap feature compared to an upper portion of the gap feature. It shall be understood that a lower portion of the gap feature refers to a portion of the gap feature which is relatively far removed from a substrate's surface, and that the upper portion of a gap feature refers to a part of the gap feature which is closer to the substrate's surface compared to the lower/deeper portion of the gap feature. Preferentially depositing metal oxide at the bottom of the gap feature can be done, for example, by employing a cyclical deposition process as described herein, such as a cyclical deposition process in which the metal precursor comprises a vanadium precursor such as $VCl_4$, and in which the oxygen reactant comprises an oxygen and hydrogen-containing compound such as $H_2O$. Suitable nitrogen reactants include compounds comprising nitrogen and hydrogen such as $NH_3$. Such a gap filling metal nitride layer, e.g. a gap filling vanadium nitride layer, can be used, for example, as an electrode in a semiconductor device. Exemplary semiconductor devices include transistors and DRAM capacitors.

In accordance with yet additional embodiments of the disclosure, a device or portion thereof can be formed using a method and/or a structure as described herein. The device can include a substrate, an insulating or dielectric layer, a layer containing vanadium and nitrogen overlying the insulating or dielectric layer, and optionally an additional metal layer overlying the layer containing vanadium and nitrogen. The device can be or form part of, for example, a MOSFET, e.g. a pMOSFET or an nMOSFET. Thus, further described is a gate-all-around field effect transistor. It comprises a gate contact comprising a layer which is formed according to a method as described herein.

In some embodiments, the pMOSFET device may be a gate-all-around pmos field effect transistor. Thus, further provided is a gate-all-around pmos field effect transistor comprising a threshold voltage tuning layer deposited by means of a method as described herein. The threshold voltage tuning layer comprises vanadium and nitrogen. Suitably, the threshold voltage shifting layer is comprised in a gate electrode comprised in the field effect transistor.

In some embodiments, a high-k dielectric layer is positioned between a silicon oxide layer and the threshold voltage tuning layer.

Further provided herein is a metal-insulator-metal (MIM) metal electrode comprising a layer comprising vanadium and nitrogen. Advantageously, the layer is formed according to a method as described herein.

Further provided herein is a vertical NAND (VNAND) contact comprising a layer comprising vanadium and nitrogen. Advantageously, the layer is formed according to a method for forming a layer on a on a substrate in a reaction chamber as described herein.

Further provided herein is a Dynamic random-access memory (DRAM) cell electrode comprising a layer comprising vanadium and nitrogen. Advantageously, the layer is formed according to a method as described herein.

Further provided herein is a wire partially or wholly lined with a layer comprising vanadium and nitrogen. Advantageously, the layer comprising vanadium and nitrogen is formed by means of a method as described herein. In some embodiments, the wire comprises copper. In some embodiments, the wire comprises tungsten. In some embodiments, the wire comprises a core that consists of, or that substantially consists of, copper and/or tungsten. Advantageously, the layer is formed according to a method for forming a layer on a on a substrate in a reaction chamber as described herein. It shall be understood that the term "wire" may refer to an interconnect or to a plurality of interconnects, which are commonly encountered in integrated circuits.

Further described is a system that comprises a reaction chamber, a precursor gas source, a reactant gas source, and a controller. The precursor gas source comprises a metal precursor. The metal precursor comprises vanadium. The reactant gas source comprises a reactant. The reactant comprises nitrogen. The controller is configured to control gas flow into the reaction chamber to form a layer overlying a surface of a substrate. The layer comprises vanadium and nitrogen. In some embodiments, the layer is deposited by means of a method as described herein.

FIG. 1 shows a schematic representation of an embodiment of a method as described herein. Method 100 can be used to, for example, form a gate electrode structure suitable for NMOS, PMOS, and/or CMOS devices, such as for uses as a p-dipole shifter in a gate, source, or drain electrode of a metal oxide semiconductor. However, unless otherwise noted, the presently described methods are not limited to such applications. The method comprises a step (111) of positioning a substrate on a substrate support. The substrate support is positioned in a reaction chamber. Suitable substrate supports include pedestals, susceptors, and the like. A metal oxide is then deposited on the substrate (112). Optionally, the reaction chamber is then purged (115) by means of a post-deposition purge. Purging can be done, for example, by means of a noble gas. Exemplary noble gasses include He, Ne, Ar, Xe, and Kr. Alternatively, the purging can comprise transporting the substrate through a purge gas curtain. During a purge, surplus chemicals and reaction byproducts, if any, can be removed from the substrate surface or reaction chamber, such as by purging the reaction space or by moving the substrate, before the substrate is contacted with the next reactive chemical.

The substrate is then exposed to a nitrogen-containing reactant (116). Optionally, the reaction chamber is then purged (117) by means of a post nitrogen reactant purge. Alternatively, the nitrogen reactant purge can comprise transporting the substrate through a purge gas curtain. Optionally, the steps of depositing a metal oxide on the substrate (112) and subjecting the substrate to a nitrogen-containing reactant (116) are repeated (119) one or more times, thus forming a super cycle which is repeated (119) one or more times. This method is continued until a metal nitride layer having a pre-determined thickness is formed on the substrate, at which point the method ends (118).

FIG. 2 shows another schematic representation of an embodiment of a method as described herein. The method comprises a step (211) of positioning a substrate on a substrate support. Then, the method comprises executing a precursor pulse (212) in which a precursor is provided to the reaction chamber. Optionally, the reaction chamber is purged after the precursor pulse (212) by means of a post precursor purge (213). Alternatively, the post precursor purge (213) can comprise transporting the substrate through a purge gas curtain. Then, the method comprises executing an oxygen reactant pulse (214) in which the substrate is exposed to an oxygen reactant. Optionally, the oxygen reactant pulse (214) can be followed by a post oxygen reactant purge (215) in which the reaction chamber can be purged by means of a purge gas. Alternatively, the post oxygen reactant purge (215) can comprise transporting the substrate through a purge gas curtain. The precursor pulse (212) and the oxygen reactant pulse (214) together form a deposition cycle. Optionally, the method comprises subsequently executing a plurality of deposition cycles, i.e. optionally the method comprises repeating (220) the precursor pulse (212) and the oxygen reactant pulse (214) one or more times. Thus, a metal oxide layer having a pre-determined thickness is deposited. After a pre-determined amount of deposition cycles, the method comprises exposing the substrate to a nitrogen reactant (216). Thus, the metal oxide layer is transformed into a metal nitride layer. Together, the sequence of the pre-determined amount of deposition cycles and the step of exposing the substrate to a nitrogen reactant (216) form a super cycle. Optionally, the method comprises repeating (219) the super cycle one or more times to obtain a metal nitride layer having a desired thickness. After the metal nitride layer has achieved a desired thickness, the method ends (218).

A method according to FIG. 1 or 2 can include heating the substrate to a desired deposition temperature within the reaction chamber. In some embodiments, a method according to FIG. 1 or 2 includes heating the substrate to a temperature of less than 800° C. For example, in some embodiments of the disclosure, heating the substrate to a deposition temperature may comprise heating the substrate to a temperature between approximately 20° C. and approximately 800° C., about 100° C. and about 500° C., about 150° C. and about 450° C., or about 200° C. and about 400° C.

In addition to controlling the temperature of the substrate, a pressure within the reaction chamber may also be regulated. For example, in some embodiments of the disclosure, the pressure within the reaction chamber during a method according to FIG. 1 or 2 may be less than 760 Torr or between 0.2 Torr and 760 Torr, about 1 Torr and 100 Torr, or about 1 Torr and 10 Torr, or less than 3 Torr, or less than 2 Torr, or less than 1 Torr.

Figure 3:
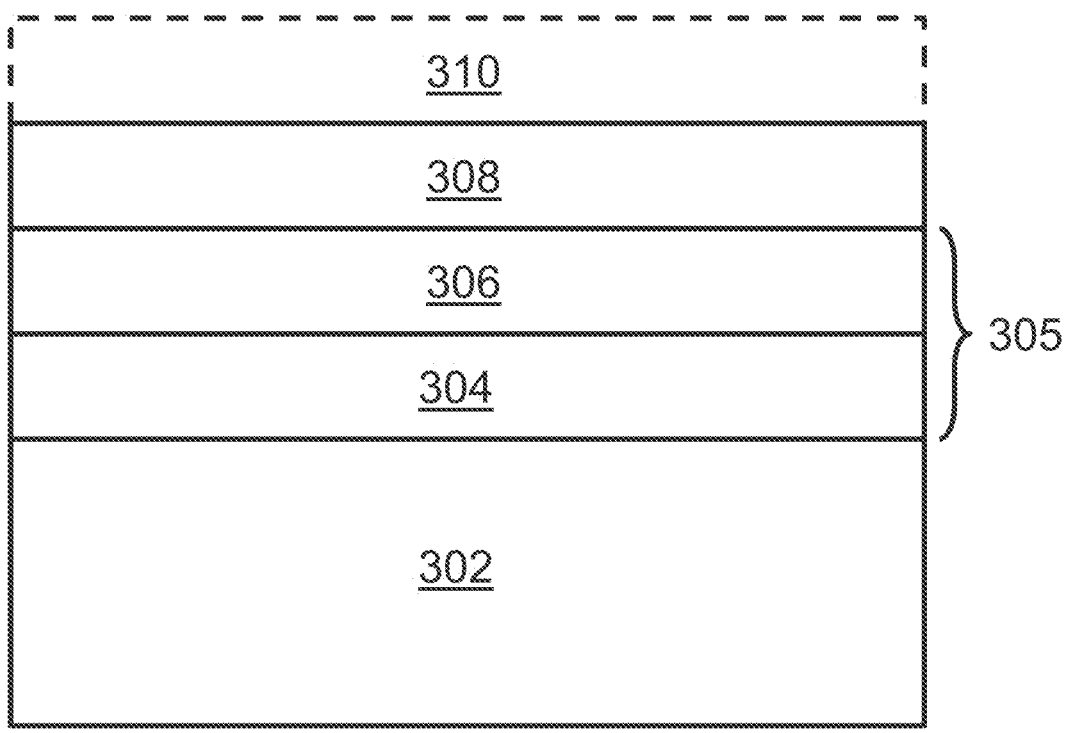
FIG. 3 illustrates a structure/a portion of a device 300 in accordance with additional examples of the disclosure.

FIG. 3 illustrates a structure/a portion of a device 300 in accordance with additional examples of the disclosure. Device or structure 300 includes a substrate 302, dielectric or insulating material 305, and a layer 308 which is formed according to a method as described herein. In the illustrated example, structure 300 also includes an additional conducting layer 310.

Substrate 302 can be or include any of the substrate materials described herein.

Dielectric or insulating material 305 can include one or more dielectric or insulating material layers. By way of example, dielectric or insulating material 305 can include an interface layer 304 and a high-k material 306 deposited overlying interface layer 304. In some cases, interface layer 304 may not exist or may not exist to an appreciable extent. Interface layer 304 can include an oxide, such as a silicon oxide, which can be formed on a surface of the substrate 302 using, for example, a chemical oxidation process or an oxide deposition process. High-k material 306 can be or can include, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), or mixtures/laminates thereof.

The layer 308 containing a metal nitride can be formed according to a method described herein. When layer 308 is formed using a cyclical deposition process, a concentration of its constituents can vary from a bottom of the layer 308 to a top of the layer 308 by, for example, controlling an amount of precursor and/or reactant and/or respective pulse times during one or more deposition cycles. In some cases, the layer 308 containing a metal nitride can have a stoichiometric composition. A work function and other properties of this layer 308 can be altered by altering its composition.

The layer 308 comprising a metal nitride can include impurities, such as halides, hydrogen or the like. In some embodiments, the impurity content may be less than one atomic percent, less than 0.2 atomic percent, or less than 0.1 atomic percent, or less than 0.05 atomic percent, alone or combined.

A thickness of the layer 308 containing a metal nitride can vary according to application. By way of examples, a thickness of this layer 308 can be less than 5 nm or about 0.2 nm to about 5 nm, or about 0.3 nm to about 3 nm, or about 0.3 nm to about 1 nm. When used, e.g., for controlling the threshold voltage in pMOSFETS, the layer 308 containing a metal nitride may be relatively thin, which may be desirable for many applications, including work function and/or voltage threshold adjustment layers. Exemplary thicknesses are from 0.1 to 5.0 nm, 0.2 to 4.0 nm, 0.3 to 3.0 nm, 0.4 to 2.0 nm, 0.5 to 1.5 nm, 0.7 nm to 1.3 nm, or 0.9 nm to 1.1 nm. In some embodiments, the layer may have a thickness of less than 0.1 nm. It shall be understood that such layers are not necessarily continuous, and may even consist of a plurality of isolated clusters of atoms and/or a plurality of isolated atoms.

Additionally or alternatively, the layer 308 containing a metal nitride can form a continuous film—e.g., using method according to FIG. 1 or according to FIG. 2—at a thickness of less than <5 nm, <4 nm, <3 nm, <2 nm, <1.5 nm, <1.2 nm, <1.0 nm, or <0.9 nm. The layer 308 containing a metal nitride can be relatively smooth, with relatively low grain boundary formation. In some cases, the layer 308 containing a metal nitride may be amorphous, or may comprise amorphous regions. Additionally or alternatively, this layer 308 may comprise relatively low columnar crystal structures (as compared to TiN). RMS roughness of an exemplary layer 308 containing a metal nitride can be <1.0 nm, <0.7 nm, <0.5 nm, <0.4 nm, <0.35 nm, or <0.3 nm, at a thickness of less than 10 nm.

A work function of a layer 308 containing a metal nitride can be >4.6 eV, >4.7 eV, >4.8 eV, >4.9 eV, >4.95 eV, or >5.0 eV. A work function value of a gate contact can be shifted by about 30 meV to about 400 meV, or about 30 meV to about 200 meV, or about 50 meV to about 100 meV using such a layer, compared to a gate contact not comprising such a layer 308.

Additional conducting layer 310 can include, for example, metal, such as a refractory metal or the like.

Figure 4:
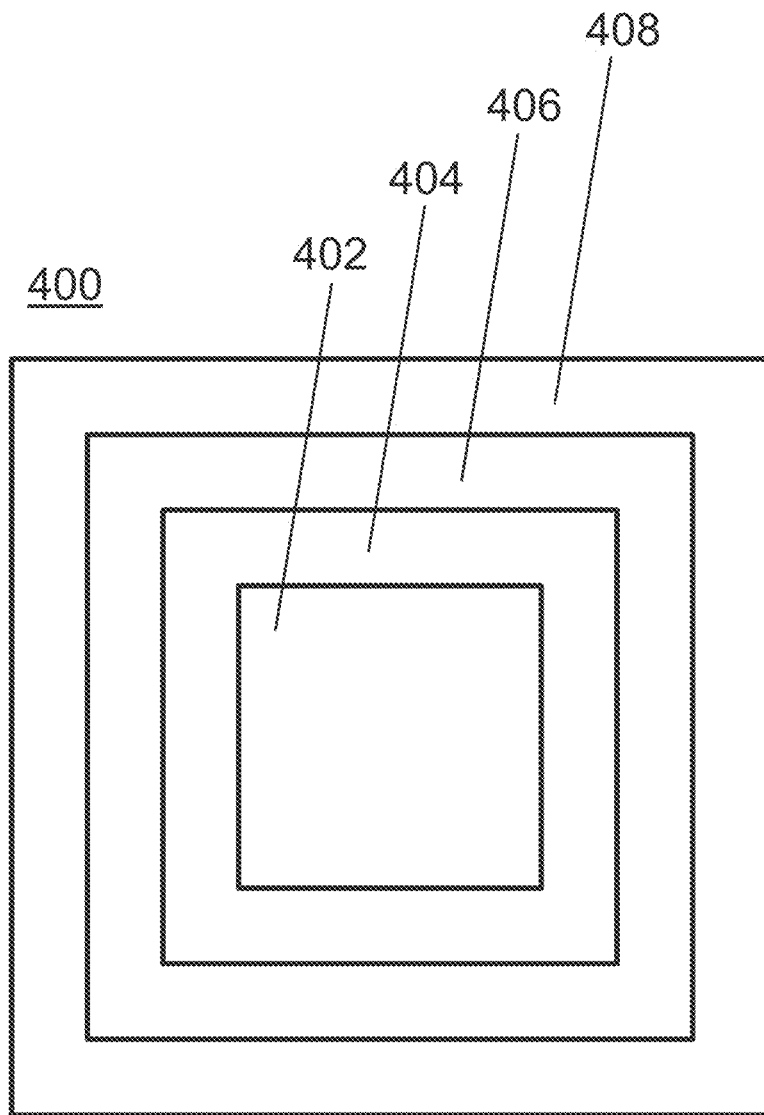
FIG. 4 illustrates another structure 400 in accordance with examples of the disclosure.

FIG. 4 illustrates another structure 400 in accordance with examples of the disclosure. Structure 400 is suitable for gate all around field effect transistors (GAA FET) (also referred to as lateral nanowire FET) devices and the like.

In the illustrated example, structure 400 includes semiconductor material 402, dielectric material 404, a layer 406 containing vanadium and nitrogen, and a conducting layer 408. Structure 400 can be formed overlying a substrate, including any substrate materials described herein. The layer 406 containing vanadium and nitrogen can be positioned between the conducting layer 408 and the dielectric material 406, as shown. Alternatively, the layer 406 containing vanadium and nitrogen can be positioned inside the conducting layer 408 (embodiment not shown).

The semiconductor material 402 can include any suitable semiconducting material. For example, the semiconductor material 402 can include Group IV, Group III-V, or Group II-VI semiconductor material. By way of example, the semiconductor material 402 can include silicon.

The dielectric material 404 can be the same or similar to dielectric or insulating material 205. The layer containing vanadium and nitrogen (406) of FIG. 4 can be similar to the layer (208) containing vanadium and nitrogen (210), described in the context of FIG. 2.

Figure 5:
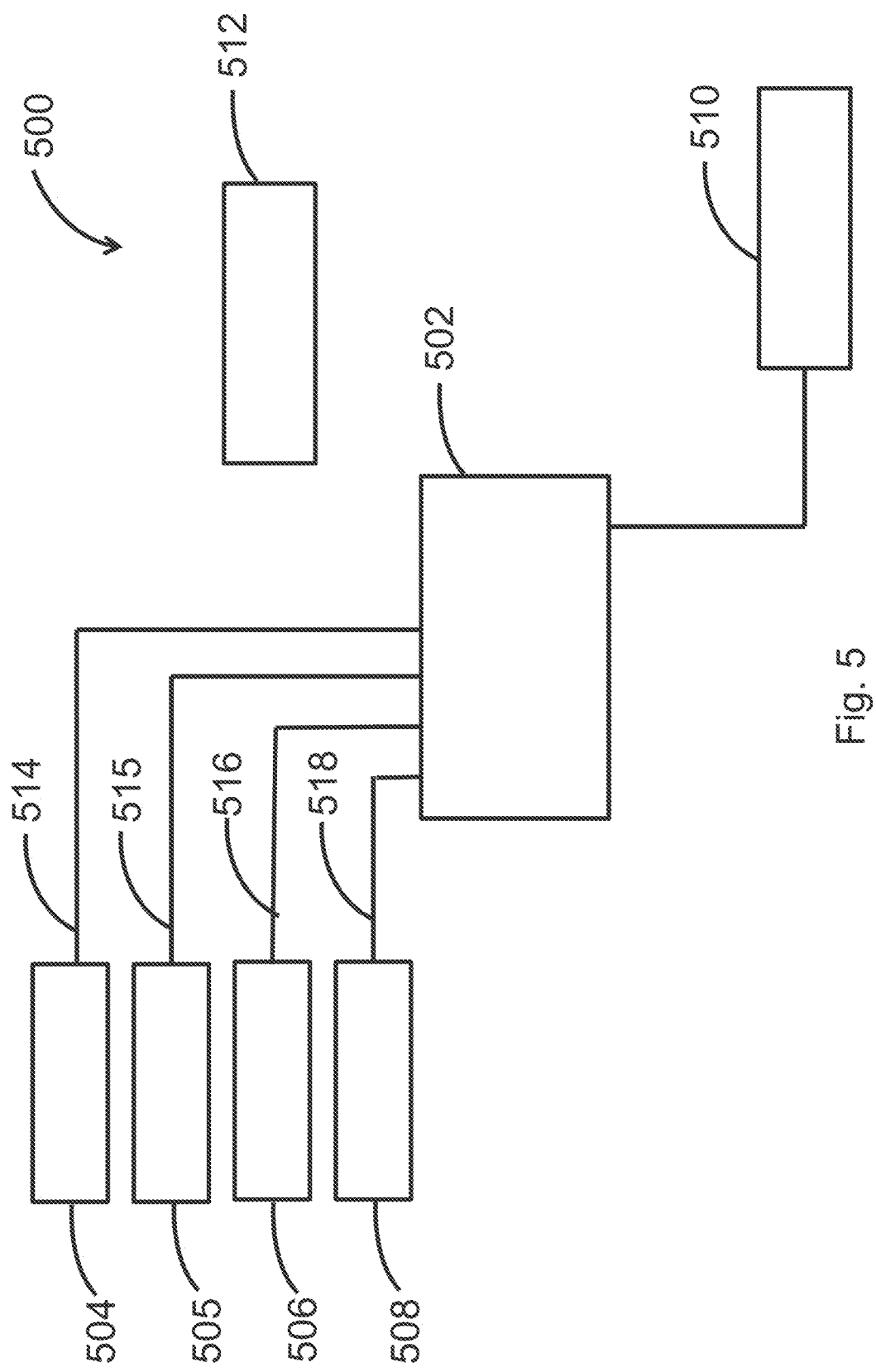
FIG. 5 illustrates a system 500 in accordance with yet additional exemplary embodiments of the disclosure.

FIG. 5 illustrates a system 500 in accordance with yet additional exemplary embodiments of the disclosure. System 500 can be used to perform a method as described herein and/or form a structure or device portion as described herein.

In the illustrated example, system 500 includes one or more reaction chambers 502, a precursor gas source 504, a reactant gas source 506, a purge gas source 508, an exhaust 510, and a controller 512.

Reaction chamber 502 can include any suitable reaction chamber, such as an ALD or CVD reaction chamber.

Precursor gas source 504 can include a vessel and one or more precursors as described herein-alone or mixed with one or more carrier (e.g., noble) gases. Reactant gas source 506 can include a vessel and one or more reactants as described herein-alone or mixed with one or more carrier gases. Purge gas source 508 can include one or more inert gases as described herein. Although illustrated with four gas sources 504-508, system 500 can include any suitable number of gas sources. Gas sources 504-508 can be coupled to reaction chamber 502 via lines 514-518, which can each include flow controllers, valves, heaters, and the like.

Exhaust 510 can include one or more vacuum pumps.

Controller 512 includes electronic circuitry and software to selectively operate valves, manifolds, heaters, pumps and other components included in the system 500. Such circuitry and components operate to introduce precursors, reactants, and purge gases from the respective sources 504-508. Controller 512 can control timing of gas pulse sequences, temperature of the substrate and/or reaction chamber, pressure within the reaction chamber, and various other operations to provide proper operation of the system 500. Controller 512 can include control software to electrically or pneumatically control valves to control flow of precursors, reactants and purge gases into and out of the reaction chamber 502. Controller 512 can include modules such as a software or hardware component, e.g., a FPGA or ASIC, which performs certain tasks. A module can advantageously be configured to reside on the addressable storage medium of the control system and be configured to execute one or more processes.

Other configurations of system 500 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber 502. Further, as a schematic representation of a system, many components have been omitted for simplicity of illustration, and such components may include, for example, various valves, manifolds, purifiers, heaters, containers, vents, and/or bypasses.

During operation of reactor system 500, substrates, such as semiconductor wafers (not illustrated), are transferred from, e.g., a substrate handling system to reaction chamber 502. Once substrate(s) are transferred to reaction chamber 502, one or more gases from gas sources 504-508, such as precursors, reactants, carrier gases, and/or purge gases, are introduced into reaction chamber 502.

Figure 6:
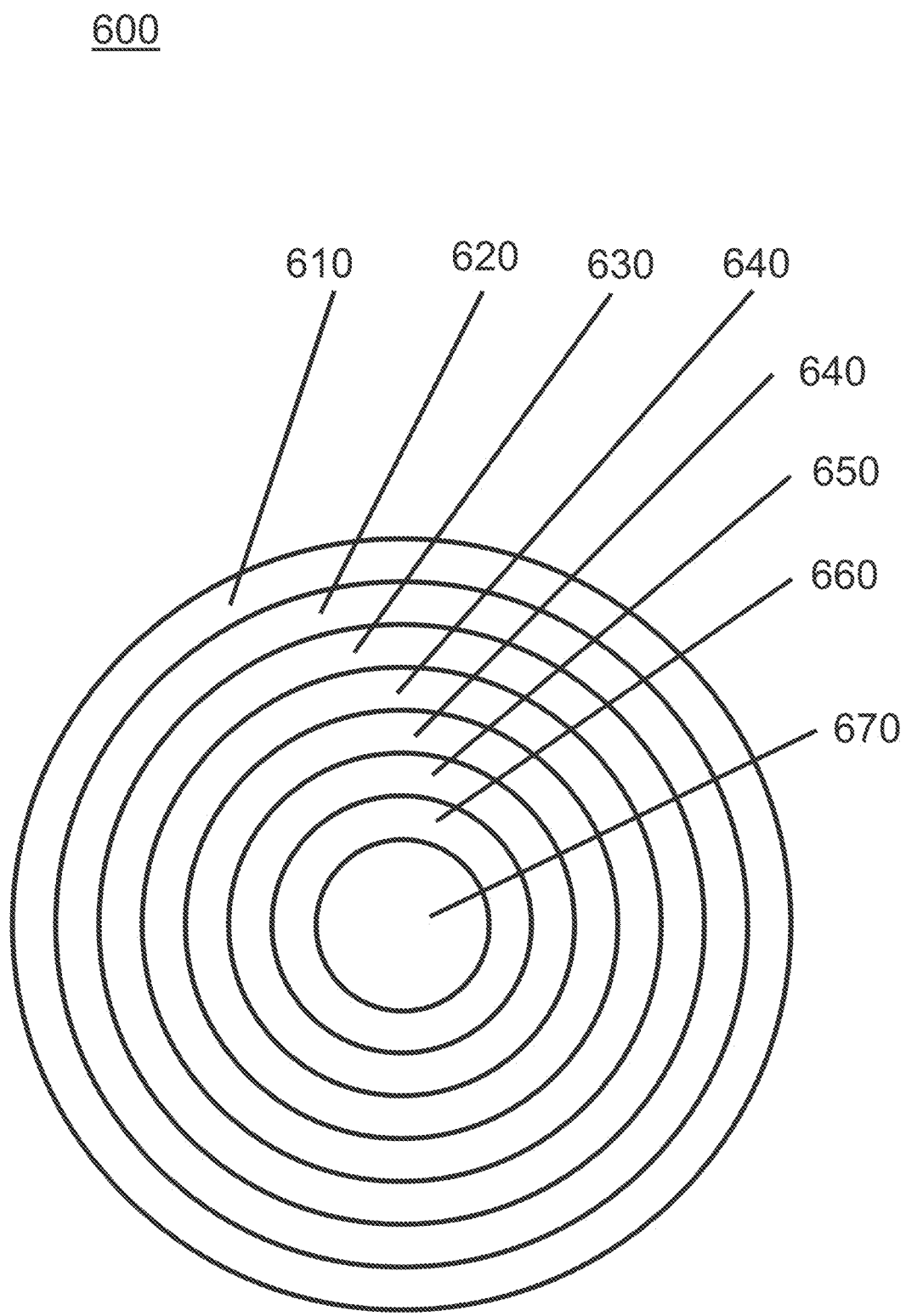
FIG. 6 illustrates an exemplary DRAM capacitor (600).

FIG. 6 illustrates an exemplary DRAM capacitor (600). It includes a top electrode (610,670) which comprises two parts, i.e. an inner shell and an outer shell, in the embodiment shown. This notwithstanding, the top electrode may comprise just one part, or may comprise more than two parts, e.g. three or more parts. It shall be understood that the two parts of the top electrode (610,670) in the embodiment of FIG. 6 are electrically connected to each other (connection not shown), i.e., it shall be understood that during normal operation, they are kept at the same, or approximately the same, electrical potential. The top electrode (610,670) comprises a layer comprising a metal and nitrogen, e.g. vanadium and nitrogen. Preferably, this layer is deposited according to the methods that are disclosed herein. The top electrode (610,670) may, for example, have a thickness of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The DRAM capacitor (600) further comprises a bottom electrode (640). The bottom electrode (640) comprises a layer comprising a metal and nitrogen, e.g. vanadium and nitrogen. In some embodiments, the composition of the bottom electrode (640) equals the composition of the top electrode (610,670). Alternatively, the composition of the bottom electrode (640) may differ from the composition of the top electrode (610,670). The bottom electrode (640) may, for example, have a thickness of at least 1.0 nm to at most 10.0 nm or of at least 3.0 nm to at most 7.0 nm, or of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The bottom electrode (640) is separated from an outer shell of the top electrode (610) by one or more dielectric layers (620,630). The embodiment shown features two dielectric layers (620,630). The one or more dielectric layers (620,630) may comprise a high-k dielectric. For example, the high-k dielectric may be selected from the list comprising hafnium oxide (HfO$_2$), tantalum oxide (Ta$_2$O$_5$), zirconium oxide (ZrO$_2$), titanium oxide (TiO$_2$), hafnium silicate (HfSiO$_x$), aluminum oxide (Al$_2$O$_3$) or lanthanum oxide (La$_2$O$_3$), and mixtures/laminates thereof. In some embodiments, dielectric layer (620) has the same composition as dielectric layer (630). In some embodiments, dielectric layer (620) has a different composition than dielectric layer (630). The combined thickness of the two dielectric layers (620,630) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. An inner shell of the top electrode (670) is separated from the bottom electrode (640) by means of one or more dielectric layers (650,660). The embodiment shown features two such dielectric layers. The one or more dielectric layers (650,660) may comprise a high-k dielectric. For example, the high-k dielectric may be selected from the list comprising hafnium oxide (HfO$_2$), tantalum oxide (Ta$_2$O$_5$), zirconium oxide (ZrO$_2$), titanium oxide (TiO$_2$), hafnium silicate (HfSiO$_x$), aluminum oxide (Al$_2$O$_3$) or lanthanum oxide (La$_2$O$_3$), and mixtures/laminates thereof. In some embodiments, dielectric layer (650) has the same composition as dielectric layer (660). In some embodiments, dielectric layer (650) has a different composition than dielectric layer (660). The combined thickness of the dielectric layers (650,660) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. In some embodiments, the thickness of the one or more dielectric layers (620,630) between the outer shell of the top electrode (610) and the bottom electrode (640) equals the thickness of the one or more dielectric layers (650,660) between the inner shell of the top electrode (670) and the bottom electrode (640), e.g. within a margin of error of less than 2.0 nm, or less than 1.5 nm, or less than 1.0 nm, or less than 0.5 nm, or less than 0.4 nm, or less than 0.3 nm, or less than 0.2 nm, or less than 0.1 nm. A gap filling dielectric (680) may be centrally disposed in the DRAM capacitor (680). Exemplary gap filling dielectrics include low-k dielectrics, e.g. SiOC, SiOCN, and the like.

Figure 7:
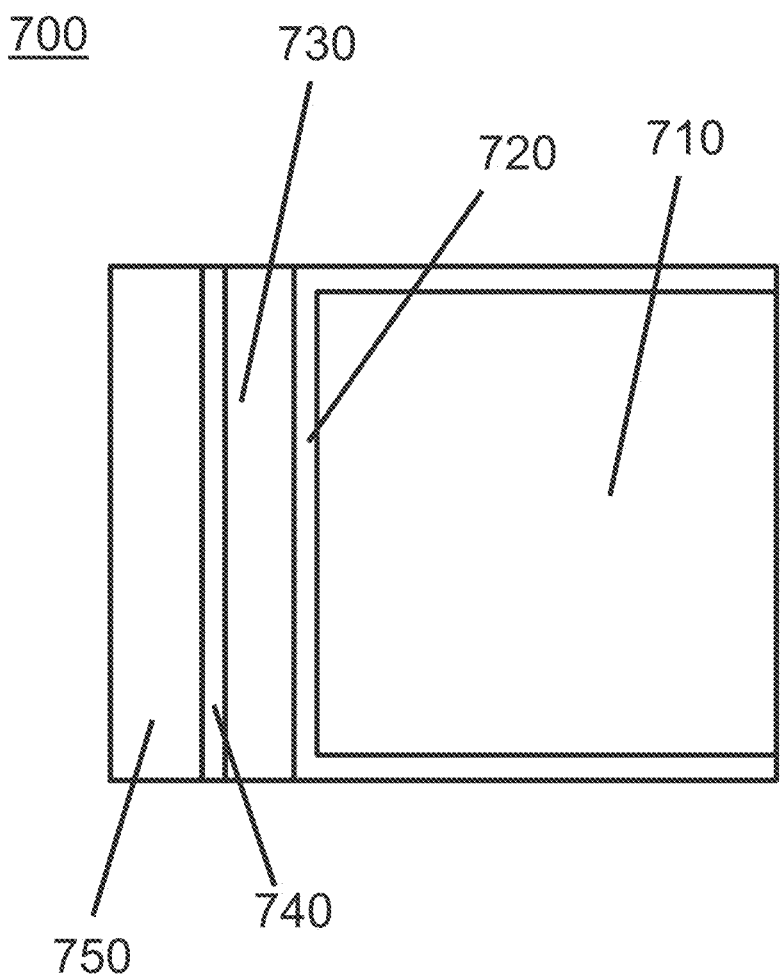
FIG. 7 illustrates a part of a VNAND cell, namely a contact and charge trapping assembly (700).

FIG. 7 illustrates a part of a VNAND cell, namely a contact and charge trapping assembly (700). The contact and charge trapping assembly (700) comprises a metal layer (710). The metal layer (710) may be made from a metal such as copper, tungsten, etc. As illustrated in FIG. 7, the metal layer (710) may be lined with a liner (720). The liner may improve adhesion and/or may prevent or at least minimize out diffusion of metal, e.g. copper or tungsten, from the metal layer (710). Advantageously, the liner (720) comprises a layer comprising a metal and nitrogen, e.g. vanadium and nitrogen. Advantageously, this layer is deposited by means of a method as described herein. The contact and charge trapping assembly (700) comprises a charge trapping layer (740). The charge trapping layer (740) is positioned between two dielectric layers (730,750). The charge trapping layer may comprise a conductive layer such as, for example, silicon nitride. Additionally or alternatively, the charge trapping layer may comprise a layer comprising a metal and nitrogen, e.g. vanadium and nitrogen. Advantageously, this layer may be deposited by means of a method as described herein. One of the dielectric layers (730) is adjacent to the liner (720). This dielectric layer (730) may, for example, comprise a high-k material. For example, the high-k dielectric may be selected from the list comprising hafnium oxide (HfO$_2$), tantalum oxide (Ta$_2$O$_5$), zirconium oxide (ZrO$_2$), titanium oxide (TiO$_2$), hafnium silicate (HfSiO$_x$), aluminum oxide (Al$_2$O$_3$) or lanthanum oxide (La$_2$O$_3$), and mixtures/laminates thereof. In a suitable configuration in a VNAND memory architecture, the other dielectric layer (750) may serve as a tunnel layer, and may be adjacent to a, e.g. doped polysilicon, channel layer (not shown).

Figure 8:
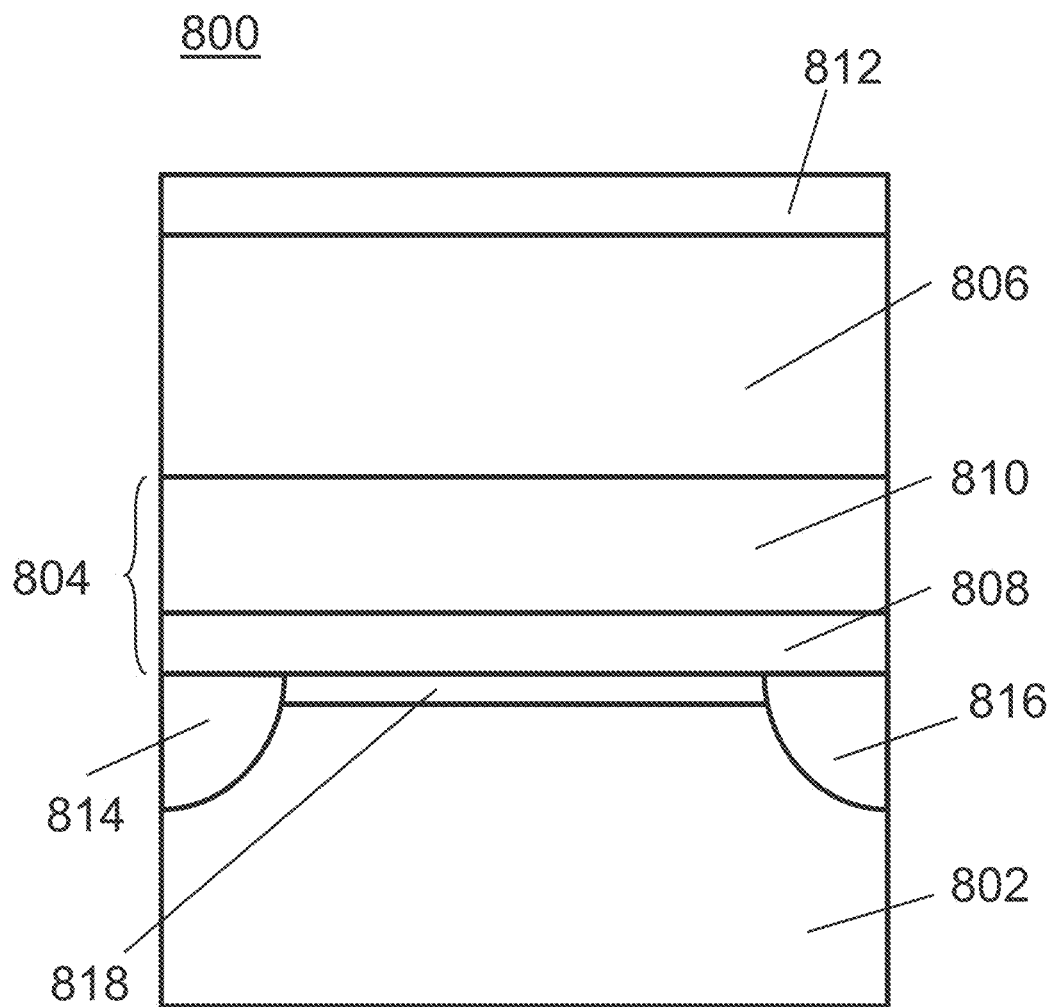
FIG. 8 illustrates another exemplary structure 800 in accordance with examples of the disclosure.

FIG. 8 illustrates another exemplary structure 800 in accordance with examples of the disclosure. Device or structure 800 includes a substrate 802, dielectric or insulating material 804, and a layer 806 containing a metal and nitrogen, e.g. vanadium and nitrogen. In the illustrated example, structure 800 also includes an additional conducting layer 812. Substrate 802, dielectric or insulating material 804, the layer 806 containing a metal and nitrogen, and an additional conducting layer 812 can be the same or similar to substrate 802, dielectric or insulating material 805, the layer 808 containing a metal and nitrogen, and conducting layer 810.

In the illustrated example, substrate 802 includes a source region 814, a drain region 816, and a channel region 818. Although illustrated as a horizontal structure, structures and devices in accordance with examples of the disclosure can include vertical and/or three-dimensional structures and devices, such as FinFET devices, and Gate-all-around MOSFETs.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

Figure 9:
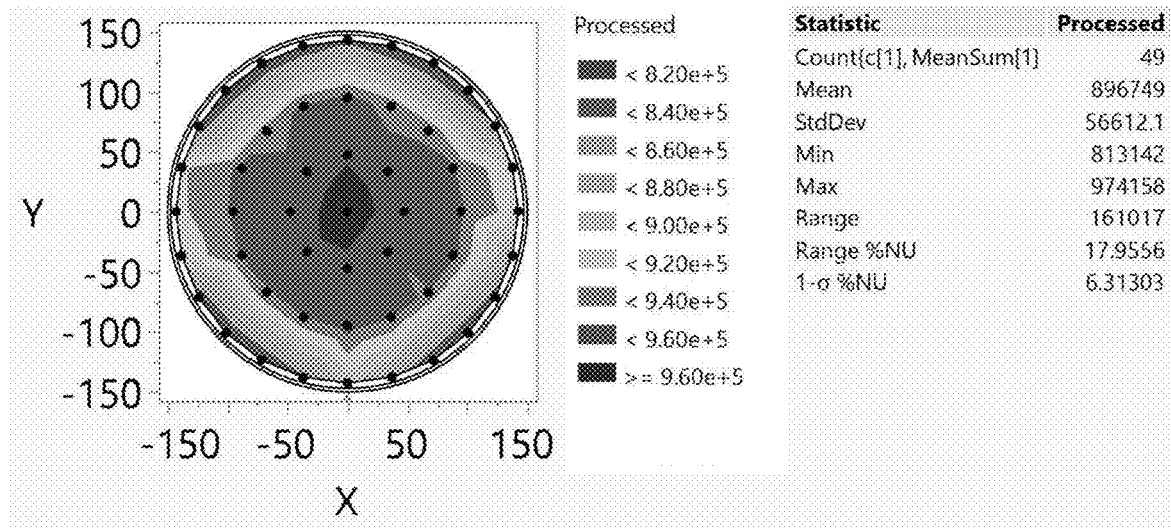
FIG. 9 shows experimental sheet resistance results related to conversion of vanadium oxide to vanadium nitride after exposure to ammonia.
Figure 9:
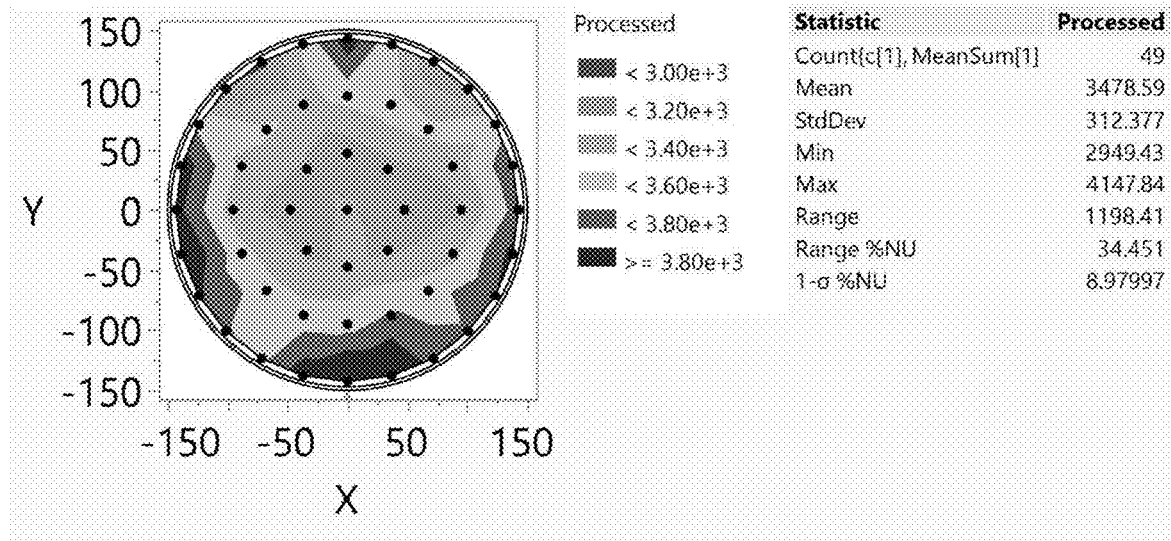

FIG. 9 shows experimental sheet resistance results related to conversion of vanadium oxide to vanadium nitride after exposure to ammonia.

In particular, panel a) shows sheet resistance data of a vanadium oxide film deposited using a cyclical deposition process comprising alternating vanadium precursor pulses and oxygen reactant pulses separated by purges. The cyclical deposition process used to deposit the vanadium oxide film employs vanadium chloride, i.e. VCl$_4$, as a vanadium precursor and H$_2$O as an oxygen reactant. The vanadium oxide film was deposited on a dielectric stack comprising a thermal silicon oxide layer covered with a hafnium oxide layer, thereby allowing to easily measure the sheet resistance of the vanadium oxide film, and after conversion to vanadium nitride, the sheet resistance of the vanadium nitride film.

Panel b) shows sheet resistance data of a vanadium nitride film obtained by annealing the vanadium oxide film the sheet resistance of which is shown in panel a). The anneal was carried out at 8 Torr, in 35 volume % NH$_3$ in Ar for 20 minutes with a susceptor temperature of 450° C. Mass measurements show a ca. 10% mass decrease upon annealing, which is consistent with a conversion of ca. 2 nm vanadium oxide to vanadium nitride. Also, after annealing, sheet resistance drops by over two 2 orders of magnitude, further indicating conversion of vanadium oxide to vanadium nitride, which is more conductive. Using the above-described method, a vanadium nitride layer having a thickness of 3 nm and a resistivity of 300 μOhm·cm was obtained. A similar layer having a thickness of only 2 nm had a resistivity of around 1000 μOhm·cm. Haze measurements favorably indicated no surface roughening after nitridation.

Figure 10:
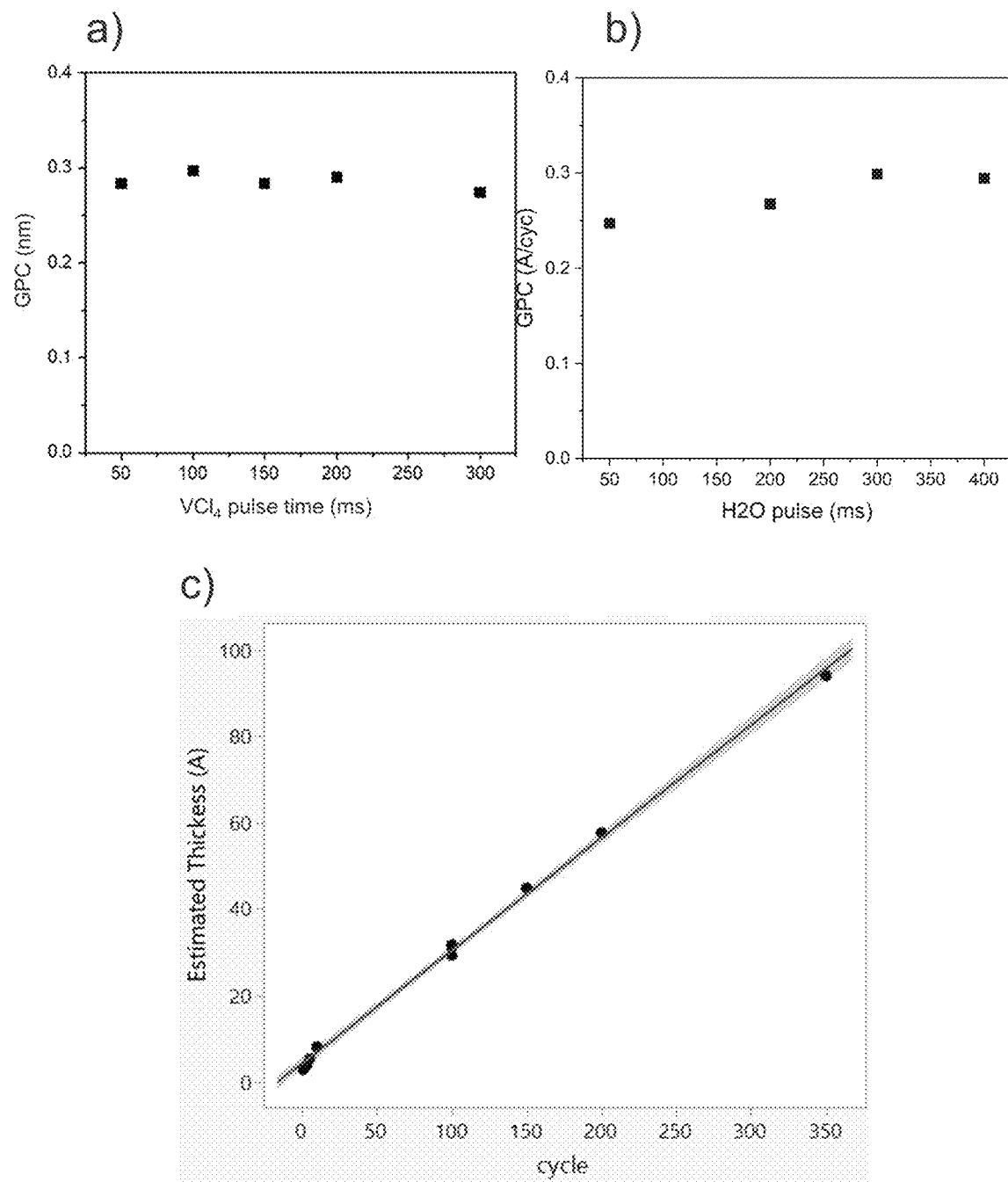
FIG. 10 shows experimental results of vanadium oxide deposition cycles performed using an embodiment of method as described herein.

FIG. 10 shows experimental results of vanadium oxide deposition cycles performed using an embodiment of method as described herein. In particular, the vanadium precursor used in this particular experiment is $VCl_4$, and the oxygen reactant used in this particular experiment is $H_2O$. Panel a) shows saturation experiments in which the vanadium oxide deposition was performed at 300° C. showing that the growth per cycle is constant irrespective of vanadium precursor pulse time, over a wide range. Panel b) shows saturation experiments performed at 300° C. showing that the growth per cycle is constant irrespective of oxygen reactant pulse time, over a wide range. Panel c) shows that the growth rate is linear from about 0 to about 350 cycles. The above-mentioned saturation and linearity experiments were performed using a $VCl_4$ pulse time of 0.1 seconds, an intra-deposition cycle purge time of 5 seconds, an oxygen reactant pulse time of 0.3 seconds, and an inter-deposition cycle purge time of 20 seconds. The process was carried out at a pressure of 1 Torr. Using such conditions, a vanadium oxide deposition process having ALD characteristics, i.e. a deposition featuring self-limiting surface reactions, can be obtained. Haze measurements favorably indicated no surface roughening after nitridation.

Figure 11:
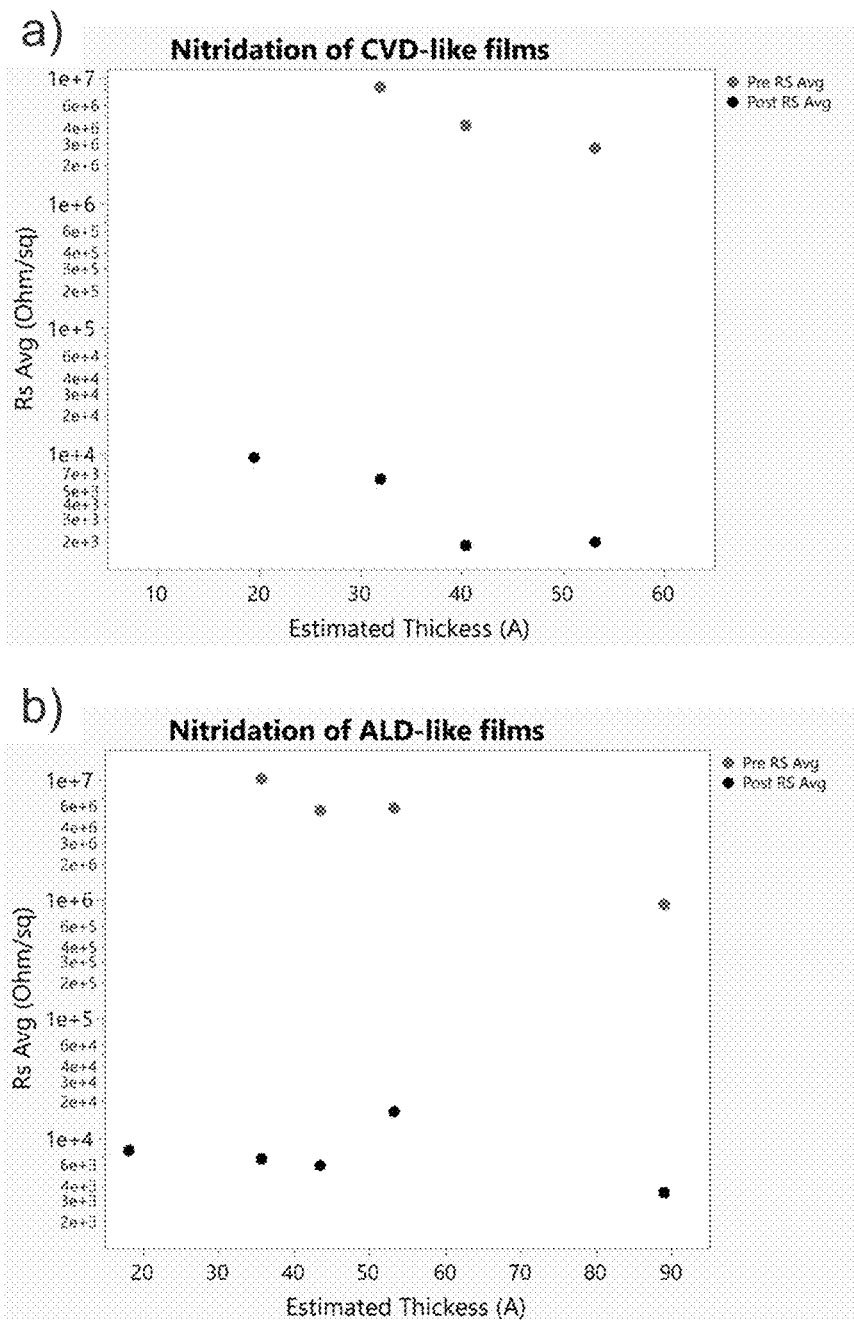
FIG. 11 shows experimental results of vanadium nitride deposition processes according to embodiments of the present disclosure.

FIG. 11 shows experimental results of vanadium nitride deposition processes according to embodiments of the present disclosure. In particular, the vanadium precursor used in these experiments is $VCl_4$, and the oxygen reactant used in this particular experiment is $H_2O$. Panel a) shows sheet resistance measurements on vanadium oxide and vanadium nitride films. The vanadium oxide layer of panel a) was grown using a $VCl_4$ pulse time of 0.1 seconds, an intra-deposition cycle purge time of 5 seconds, an oxygen reactant pulse time of 3 seconds, and an inter-deposition cycle purge time of 1 seconds. The process was carried out at a pressure of 1 Torr and at a temperature of 300° C. Using such conditions, a vanadium oxide deposition process having CVD characteristics, i.e. a deposition featuring non-self-limiting gas phase reactions, can be obtained. The vanadium oxide layer of panel b) was grown using the ALD-like deposition process disclosed in the context of the discussion of FIG. 10 panel c). After vanadium oxide deposition, for both ALD-like and CVD-like vanadium oxide depositions, the substrate comprising a vanadium oxide layer was annealed in an $NH_3$ ambient, thus resulting in a conversion of at least a top part of the vanadium oxide layer into vanadium nitride. The sheet resistance measurements shown in FIG. 11 indicate a sheet resistance reduction of 3 orders of magnitude upon annealing in an $NH_3$ ambient, both for the ALD-like and the CVD-like vanadium oxide depositions. About 4 nm of vanadium oxide was converted to vanadium nitride in both cases experiment. Haze measurements favorably indicated no surface roughening after nitridation.

FIG. 12, panel a) shows the result of a cyclical deposition process as described in FIG. 1 or 2. Indeed, by alternatingly depositing a thin metal oxide layer and subjecting that metal oxide layer to a nitrogen-containing reactant, a metal nitride layer having a desired thickness can be gradually grown. FIG. 12, panel b) shows that the sheet resistance of such a metal nitride layer gradually decreases with increasing estimated thickness, which corresponds to increasing number of super cycles.

The invention claimed is:

1. A method for forming a layer comprising a metal nitride on a substrate, the method comprising:
    providing the substrate in a reaction chamber;
    depositing a metal oxide on the substrate by an atomic layer deposition process, wherein depositing the metal oxide on the substrate by an atomic layer deposition process comprises performing a plurality of deposition cycles, each deposition cycle comprising a metal precursor pulse and an oxygen reactant pulse, wherein the metal precursor pulse comprises exposing the substrate to a metal precursor, and wherein the oxygen reactant pulse comprises exposing the substrate to an oxygen reactant; and,
    exposing the substrate to a nitrogen-containing reactant, thereby converting the metal oxide to a metal nitride,
    wherein the metal nitride consists essentially of a transition metal and nitrogen or a rare earth metal and nitrogen, and
    wherein the nitrogen-containing reactant is flowed during the depositing the metal oxide.

2. The method according to claim 1, wherein the oxygen reactant is selected from $H_2O_2$ or an alcohol.

3. The method according to claim 1, wherein the metal nitride is conductive.

4. The method according to claim 1, wherein the metal nitride comprises vanadium nitride, and wherein the metal oxide comprises vanadium oxide.

5. The method according to claim 1, wherein the metal precursor comprises a transition metal precursor.

6. The method according to claim 1, wherein the metal precursor is selected from a halide, an oxyhalide, and an organometallic compound.

7. The method according to claim 5, wherein the metal precursor comprises a vanadium precursor.

8. The method according to claim 7, wherein the vanadium precursor comprises a vanadium halide.

9. The method according to claim 8, wherein the vanadium halide comprises vanadium chloride.

10. The method according to claim 7, wherein the vanadium precursor comprises a vanadium beta-diketonate.

11. The method according to claim 1, wherein the metal precursor pulse and the oxygen reactant pulse are separated by an intra deposition cycle purge.

12. The method according to claim 1, further comprising a step of curing the metal nitride after exposing the substrate to the nitrogen-containing reactant.

13. The method according to claim 1, wherein exposing the substrate to the nitrogen-containing reactant comprises providing a nitrogen reactant to the reaction chamber, the nitrogen reactant being selected from $NH_3$, $N_2H_2$, and $N_2$.

14. The method according to claim 1, wherein exposing the substrate to the nitrogen-containing reactant comprises generating a nitrogen-containing plasma in the reaction chamber, wherein generating the nitrogen-containing plasma in the reaction chamber comprises providing a nitrogen-containing plasma gas to the reaction chamber, and wherein the nitrogen-containing plasma gas comprises at least one nitrogen-containing gas selected from $NH_3$, $N_2$, and $N_2H_2$.

15. The method according to claim 1, wherein the oxygen reactant comprises $H_2O$.

16. A method for forming a layer comprising a metal nitride on a substrate, the method comprising:
    providing the substrate in a reaction chamber; and
    performing a plurality of super cycles, wherein a super cycle comprises:

depositing a metal oxide on the substrate by an atomic layer deposition process, and, exposing the substrate to a nitrogen-containing reactant, thereby converting the metal oxide to a metal nitride, wherein the metal nitride consists essentially of a transition metal and nitrogen or a rare earth metal and nitrogen, and wherein the nitrogen-containing reactant is continually flowed during the plurality of super cycles.

17. The method according to claim 16, wherein subsequent super cycles are separated by an inter super cycle purge.

18. A method of forming a vanadium nitride on a substrate, the method comprising:

providing the substrate in a reaction chamber;

depositing a vanadium oxide on the substrate by an atomic layer deposition process comprising performing a plurality of deposition cycles, each deposition cycle comprising:

providing a vanadium halide precursor pulse to the reaction chamber, and providing an oxygen reactant pulse to the reaction chamber; and exposing the substrate to a nitrogen-containing reactant, thereby converting the vanadium oxide to a vanadium nitride, wherein the nitrogen-containing reactant is continually provided during the plurality of deposition cycles.

\* \* \* \* \*